(12) United States Patent
Mitani

(10) Patent No.: US 7,234,352 B2
(45) Date of Patent: Jun. 26, 2007

(54) ANGULAR VELOCITY SENOR

(75) Inventor: Tomohiro Mitani, Takefu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/244,163

(22) Filed: Oct. 6, 2005

(65) Prior Publication Data

US 2006/0089019 A1 Apr. 27, 2006

(30) Foreign Application Priority Data

Oct. 7, 2005 (JP) ............................. 2004-294779

(51) Int. Cl.
*G01C 19/00* (2006.01)
(52) U.S. Cl. .................... 73/504.16; 439/76.2; 73/431; 73/493
(58) Field of Classification Search ............ 73/504.16, 73/431, 493, 514.04, 514.12; 439/76.2
See application file for complete search history.

(56) References Cited

U.S. PATENT DOCUMENTS

| | | | | |
|---|---|---|---|---|
| 5,099,396 A | * | 3/1992 | Barz et al. .................. | 361/818 |
| 5,131,273 A | * | 7/1992 | Tabata et al. ............ | 73/504.16 |
| 5,345,823 A | * | 9/1994 | Reidemeister et al. ..... | 73/514.2 |
| 5,473,109 A | * | 12/1995 | Plankl et al. ................ | 174/363 |
| 5,581,032 A | * | 12/1996 | Uemura et al. ............... | 73/493 |
| 6,011,700 A | * | 1/2000 | Matsuzaki .................. | 361/816 |
| 6,472,595 B1 | * | 10/2002 | Huang ......................... | 174/382 |
| 6,739,192 B1 | * | 5/2004 | Okoshi et al. ........... | 73/504.16 |
| 6,880,399 B1 | * | 4/2005 | Okoshi et al. ................ | 73/493 |
| 7,036,372 B2 | * | 5/2006 | Chojnacki et al. ....... | 73/504.12 |
| 2002/0046604 A1 | * | 4/2002 | Ishikawa et al. ......... | 73/504.12 |
| 2002/0184947 A1 | * | 12/2002 | Yamazaki ................ | 73/504.12 |

FOREIGN PATENT DOCUMENTS

| | | | |
|---|---|---|---|
| EP | 678730 A1 | * | 10/1995 |
| JP | 8-271257 | | 10/1996 |
| JP | 2006041298 A | * | 2/2006 |

* cited by examiner

*Primary Examiner*—Hezron Williams
*Assistant Examiner*—Samir M. Shah
(74) *Attorney, Agent, or Firm*—Wenderoth, Lind & Ponack, L.L.P.

(57) ABSTRACT

An angular velocity sensor includes a tuning fork unit; a base block provided with a terminal for outputting an output signal from the tuning fork unit to the exterior; a cover for housing the tuning fork unit in a space defined by combination with the base block; a circuit board for fixing the terminal on the base block, the circuit board being provided with a processing circuit for processing the output signal from the tuning fork unit; and a casing for housing the base block, the cover, and the circuit board. The terminal on the base block is fixed to the circuit board, with a clearance being defined by the base block and the circuit board. The terminal on the base block in the clearance has a flexure portion, and the flexure portion absorbs a vibration of a high frequency applied from the exterior.

20 Claims, 4 Drawing Sheets

ANGULAR VELOCITY SENOR

BACKGROUND OF THE INVENTION

1. Field of the Invention

The present invention relates to an angular velocity sensor, and more particularly to an angular velocity sensor for use in posture control of a movable object such as an aircraft and an automotive vehicle, a navigation system or the like.

2. Description of the Related Art

A well-known angular velocity sensor has a construction as shown in FIG. 7. FIG. 7 is a cross-sectional side view of the conventional angular velocity sensor.

The angular velocity sensor shown in FIG. 7 has a base block 1 on which a tuning fork portion (not shown) is firmly fixed and a plurality of terminals 2 are mounted, so that an output signal from the tuning fork portion is outputted to the exterior by way of the terminals 2. The tuning fork portion is housed in a space defined by the base block 1 and a cover 3.

The terminals 2 on the base block 1 are fixed spaced apart from each other on a first circuit board 4 by soldering. The first circuit board 4 is electrically connected to one end of a connection terminal 5. A second circuit board 6 is electrically connected to the other end of the connection terminal 5, with a processing circuit 7 constituted of an integrated circuit (IC) being provided on the upper surface of the second circuit board 6. The processing circuit 7 is adapted to process the output signal from the tuning fork portion.

Both ends of the first circuit board 4 are supported by a pair of rubber members 8. The rubber members 8 absorb vibrations so that a strong vibration from the exterior may not be directly applied to the tuning fork portion. A pair of support blocks 9 support the first circuit board 4 by way of the rubber members 8, and directly support the second circuit board 6. A casing 10 accommodates therein the base block 1, the cover 3, the first circuit board 4, the connection terminal 5, the second circuit board 6, the rubber members 8, and the support blocks 9.

An operation of the conventional angular velocity sensor having the above construction is described. The tuning fork portion flexes and vibrates at a velocity v with its predetermined natural frequency in its driving direction in response to application of an alternating current. In this state, when the tuning fork portion rotates at an angular velocity ω about a central axis thereof, a Coriolis force F=2 mv×ω generates in the tuning fork portion. An electric charge, which is generated in the tuning fork portion (not shown) by the Coriolis force, is amplified by the processing circuit 7 on the second circuit board 6. The amplified output voltage is measured by an external computer (not shown). Thus, the angular velocity of an object is detected. Japanese Unexamined Patent Publication No. 8-271257 discloses information reciting the conventional art relating to the invention, for example.

In the conventional arrangement, vibrations are absorbed by the rubber members 8 to prevent direct transmission of a strong vibration from the exterior to the tuning fork portion. Since the first circuit board 4 is supported by the rubber member pair 8, if the rubber members 8 are not properly fitted in the support blocks 9, the first circuit board 4 may likely be tilted, with the result that the tuning fork portion housed in the space defined by the base block 1 and the cover 3 may be tilted. Thereby, the output signal from the tuning fork portion may be diminished, and the output characteristic of the angular velocity sensor may be unstable.

SUMMARY OF THE INVENTION

It is an object of the present invention to provide an angular velocity sensor that enables reduction of a tilt of a tuning fork unit housed in a space defined by a base block and a cover, and stabilization of the output characteristic of the angular velocity sensor.

An angular velocity sensor according to an aspect of the invention comprises: a tuning fork unit; a base block provided with a terminal for outputting an output signal from the tuning fork unit to the exterior of the tuning fork unit; a cover for housing the tuning fork unit in a space defined by combination with the base block; a circuit board for fixing the terminal on the base block, the circuit board being provided with a processing circuit for processing the output signal from the tuning fork unit; and a casing for housing the base block, the cover, and the circuit board therein. The terminal on the base block is fixed to the circuit board, with a clearance being defined by the base block and the circuit board, and the terminal on the base block in the clearance has a flexure portion.

In the angular velocity sensor, the flexure portion absorbs a vibration of a high frequency applied from the exterior. Accordingly, unlike a conventional arrangement in which a circuit board is supported by rubber members, the circuit board can be directly supported by the casing. As a result, there is no or less likelihood that the tuning fork unit may be tilted by tilting of the circuit board, unlike the conventional arrangement. Thus, the angular velocity sensor with a stabilized output characteristic is provided.

These and other objects, features and advantages of the present invention will become more apparent upon reading the following detailed description along with the accompanying drawings.

DETAILED DESCRIPTION OF THE PREFERRED EMBODIMENTS

Figure 1:
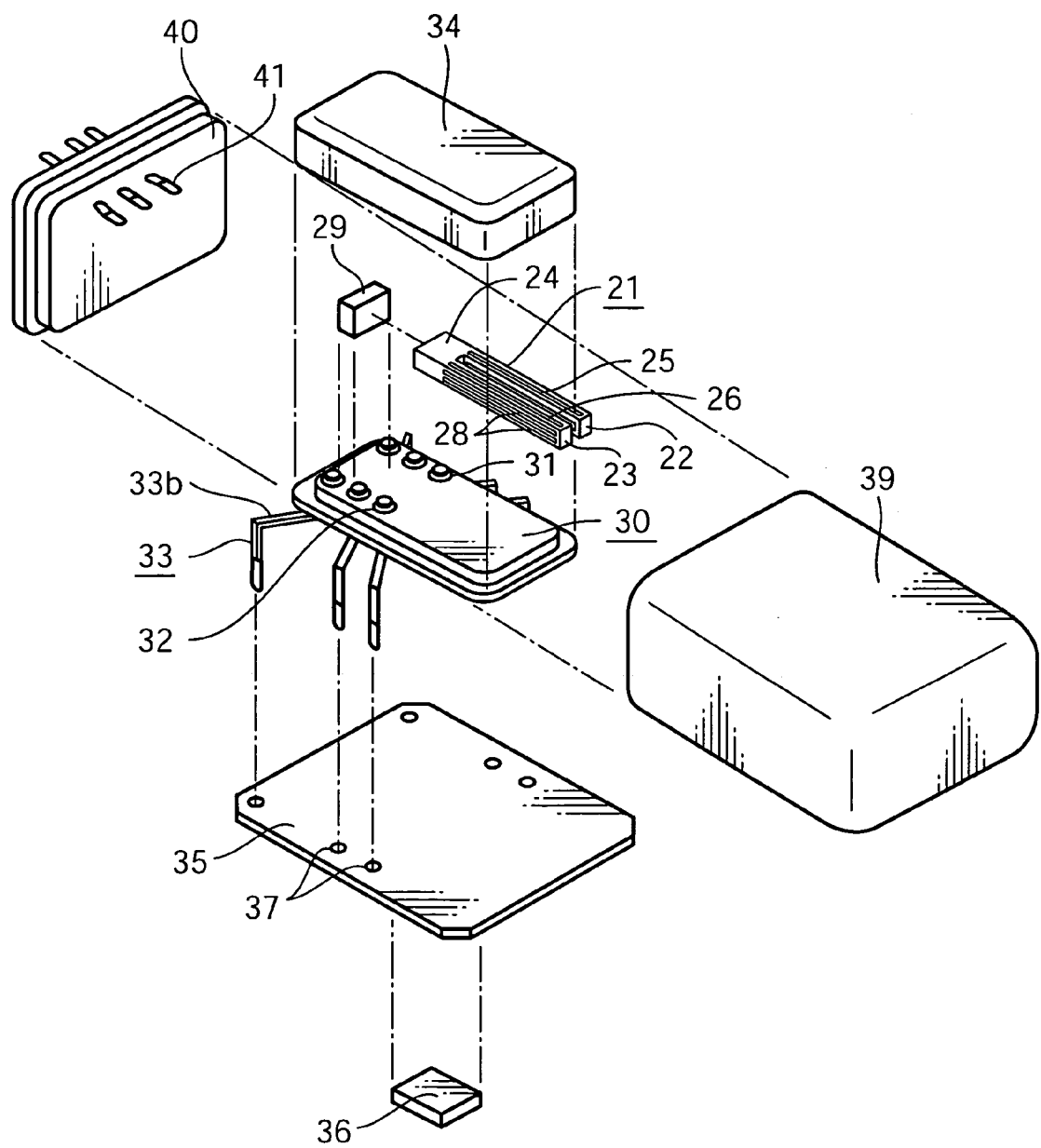
FIG. 1 is an exploded perspective view of an angular velocity sensor according to an embodiment of the invention.
Figure 2:
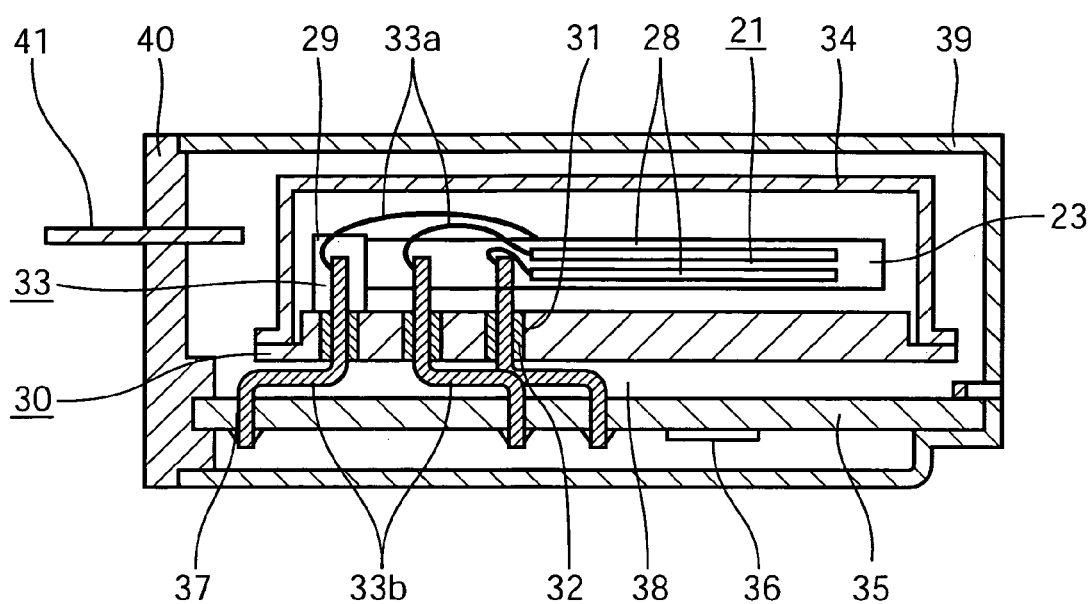
FIG. 2 is a cross-sectional side view of the angular velocity sensor shown in FIG. 1.
Figure 3:
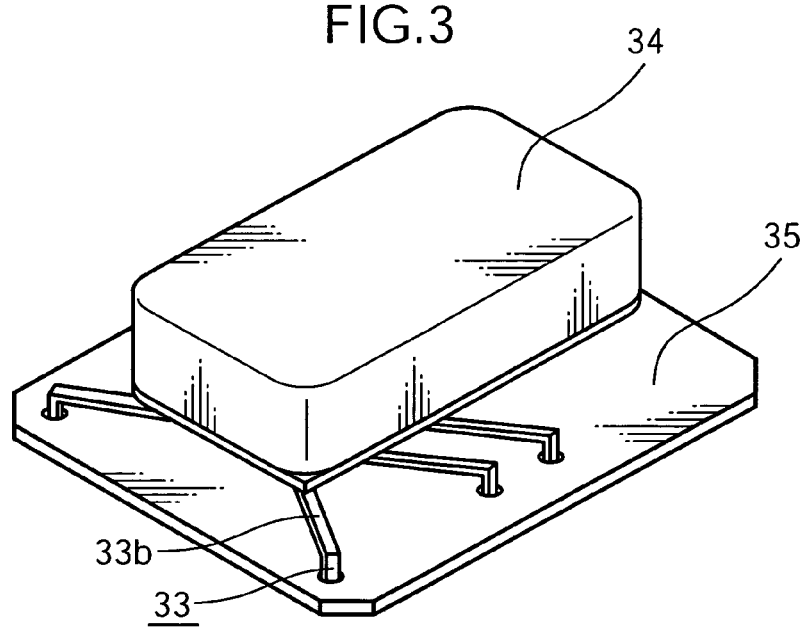
FIG. 3 is a perspective view showing a state in which a base block is fixed to a circuit board of the angular velocity sensor shown in FIG. 1
Figure 4:
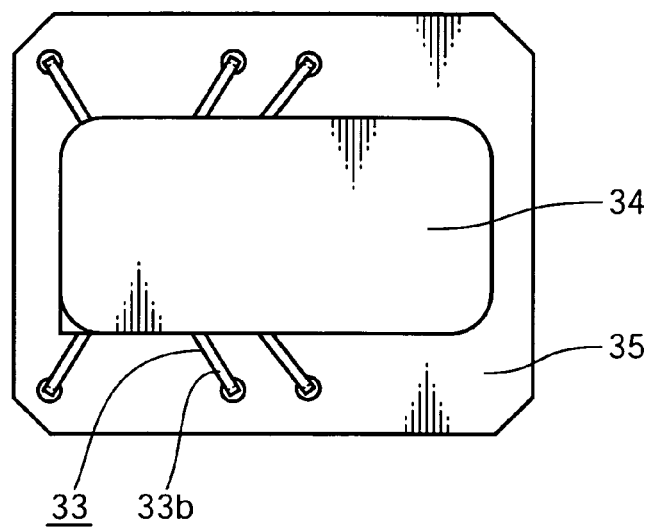
FIG. 4 is a top plan view showing a state in which the base block is fixed to the circuit board of the angular velocity sensor shown in FIG. 1.

In the following, an angular velocity sensor in accordance with an embodiment of the invention is described referring to the drawings. FIG. 1 is an exploded perspective view of the angular velocity sensor in accordance with the embodiment of the invention. FIG. 2 is a cross-sectional side view of the angular velocity sensor. FIG. 3 is a perspective view showing a state in which a base block of the angular velocity sensor is fixed to a circuit board. FIG. 4 is a top plan view showing a state in which the base block of the angular velocity sensor is fixed to the circuit board.

The angular velocity sensor shown in FIGS. 1 through 4 includes a tuning fork unit 21 made of crystal. The tuning fork unit 21 is constituted of a quadrangular prismatic drive electrode vibrator 22, a quadrangular prismatic detection electrode vibrator 23 arranged parallel to the drive electrode vibrator 22, and a connecting portion 24 for integrally connecting an end of the drive electrode vibrator 22 and an end of the detection electrode vibrator 23.

A drive electrode 25 made of gold is attached to each of a top surface, a bottom surface, and two side surfaces of the drive electrode vibrator 22. Also, a monitor electrode 26 made of gold is attached to each of a top surface and a bottom surface of the detection electrode vibrator 23. A ground electrode (not shown) made of gold is attached to an inner side surface of the detection electrode vibrator 23, and a pair of detection electrodes 28 made of gold are attached to an outer side surface of the detection electrode vibrator 23.

A member denoted by the reference numeral 29 is a rectangular parallelepiped metallic support block. The support block 29 supports a proximal end of the connecting portion 24. A member denoted by the reference numeral 30 is a metallic base block to which a lower portion of the support block 29 is firmly fixed. Plural terminal through-holes 31 (in this embodiment, six terminal through-holes 31) are formed in the base block 30. An insulating member 32 is attached to an inner circumference of each of the terminal through-holes 31, and a terminal 33 is passed through each one of the terminal through-holes 31 in the base block 30 by way of the insulating member 32.

The six terminals 33 on the base block 30 are electrically connected to the drive electrodes 25, the detection electrodes 28, the ground electrode, and to the monitor electrodes 26 via lead wires 33a shown in FIG. 2, respectively. Each of the terminals 33 has a flexure portion 33b. The flexure portion 33b is made of a thin plate with a smaller thickness in a direction perpendicular to a vibrating surface of the tuning fork unit 21 than a thickness in a direction parallel to the vibrating surface.

A member denoted by the reference numeral 34 is a metallic cover, and is adapted to cover the top surface of the base block 30. The tuning fork unit 21 constituted of the drive electrode vibrator 22, the detection electrode vibrator 23, and the connecting portion 24 is housed in a space defined by the cover 34 and the base block 30.

A circuit board 35 is provided underneath the base block 30, with a processing circuit 36 constituted of an electronic component being mounted on the bottom surface thereof. An electric charge, which is generated by application of an angular velocity, is outputted from the detection electrodes 28 of the detection electrode vibrator 23 to the processing circuit 36 via the terminals 33, and the outputted electric charge is converted into an output voltage by the processing circuit 36.

Holes 37 are formed in the circuit board 35 so that the terminals 33 are mounted in the corresponding respective holes 37. The terminals 33 are fixed to the circuit board 35 by soldering.

As shown in FIG. 2, in fixing the terminals 33 on the base block 30 to the circuit board 35 by soldering, the terminals 33 are fixed to the circuit board 35 in such a manner that a clearance 38 is defined between the circuit board 35 and the base block 30, and that the terminals 33 located in the clearance 38 each have the flexure portion 33b made of a thin plate.

A member denoted by the reference numeral 39 is a metallic outer casing, and is adapted to house therein the base block 30, the cover 34, and the circuit board 35. A member denoted by the reference numeral 40 is a lid made of a resin, and is adapted to close the opening of the outer casing 39. Plural outer terminals 41 are integrally formed on the lid 40. Each of the outer terminals 41 has one end thereof electrically connected to the processing circuit 36 constituted of the electronic component on the circuit board 35, and the other end thereof protruding outward. The outer casing 39 and the lid 40 directly support the circuit board 35.

The angular velocity sensor is constructed in such a manner that each of the flexure portions 33b of the terminals 33 is formed into a thin plate having a smaller thickness in the direction perpendicular to the vibrating surface of the tuning fork unit 21. This arrangement is advantageous in absorbing and attenuating a vibration from the exterior by the flexure portions 33b. The shape and the material of the tuning fork unit 21, and the material, the shape, the arranged position, and the number of the respective electrodes are not specifically limited to the above, and various modifications are applicable.

Next, described is a process of how the angular velocity sensor having the above arrangement in the embodiment is assembled. First, the crystal tuning fork unit 21 integrally formed of the drive electrode vibrator 22, the detection electrode vibrator 23, and the connecting portion 24 is prepared.

Next, the drive electrode 25 is attached to each of the top surface, the bottom surface, and the two side surfaces of the drive electrode vibrator 22, the monitor electrode 26 is attached to each of the top surface and the bottom surface of the detection electrode vibrator 23, the ground electrode is attached to the inner side surface of the detection electrode vibrator 23, and the detection electrodes 28 is attached to the outer side surface of the detection electrode vibrator 23, respectively by vapor deposition of gold. Subsequently, the proximal end of the tuning fork unit 21 is fixed to the support block 29, and then, the lower surface of the support block 29 is fixed to the top surface of the base block 30.

Then, after an intermediate portion of each terminal 33 made of a cylindrical lead wire is plastically deformed into a thin plate, the thin-plate-like flexure portion 33b of the terminal 33 is formed by bending the intermediate portion of the terminal 33. In this way, since the flexure portion 33b is made of the flat plate produced by plastically deforming the cylindrical lead wire, the flexure portion 33b of the terminal 33 is shaped into the thin plate. Since the soldered portion of the terminal 33 to the circuit board 35 has a cylindrical shape, the terminal 33 is fixed to the circuit board 35 with a sufficient soldering strength.

Next, the terminals 33 are passed through the corresponding respective terminal through-holes 31 in the base block 30, with the respective insulating members 32 being attached to the inner circumferences of the terminal through-holes 31. Then, the terminals 33 are electrically connected to the drive electrodes 25, the detection electrodes 28, the ground electrode, and to the monitor electrodes 26 via the lead wires 33a, respectively. Subsequently, the terminals 33 are passed in the corresponding respective holes 37 in the circuit board 35, with the clearance 38 being defined by the base block 30 and the circuit board 35, and then, the circuit board 35 and the terminals 33 are electrically connected to each other by soldering.

Next, after the cover 34 and the base block 30 are housed in the outer casing 39, the processing circuit 36 constituted of the electronic component on the circuit board 35, and the outer terminals on the lid 40 are electrically connected to each other. Lastly, the opening of the outer casing 39 is closed by the lid 40.

Now, an operation of the thus assembled angular velocity sensor in the embodiment is described.

The drive electrode vibrator 22 is flexed and vibrated in its driving direction at the velocity v with its natural frequency in the driving direction in response to application of an alternating current to the drive electrodes 25 of the drive electrode vibrator 22 of the tuning fork unit 21. The flexure vibration is transmitted to the detection electrode vibrator 23 opposing the drive electrode vibrator 22 by way of the connecting portion 24. As a result, the detection electrode vibrator 23 also flexes and vibrates in its driving direction at the velocity v with its natural frequency in the driving direction.

When the tuning fork unit 21 rotates at the angular velocity ω about its longitudinal central axis thereof in a state in which the drive electrode vibrator 22 and the detection electrode vibrator 23 are flexed and vibrated in the above-mentioned manner, a Coriolis force F=2 mv×ω is generated in the detection electrode vibrator 23. An electrical charge, which is generated in the detection electrodes 28 of the detection electrode vibrator 23 due to the generation of the Coriolis force, is outputted to the processing circuit 36 constituted of the electronic component on the circuit board 35 by way of the terminals 33, and the output is converted into an output voltage by the processing circuit 36. The output voltage is outputted to an external computer (not shown) via the outer terminals 41 on the lid 40. Thus, the angular velocity of the object is detected.

In the case where an unnecessary vibration is applied from the exterior to the angular velocity sensor, the natural frequency f of the vibrating object is represented by the following formula (1):

$$f = \frac{1}{2 \times \pi} \sqrt{\frac{K}{M}} \quad (1)$$

where K represents a spring constant, and M represents a mass.

The vibration is transmitted to the tuning fork unit 21 via the terminals 33.

Figure 5:
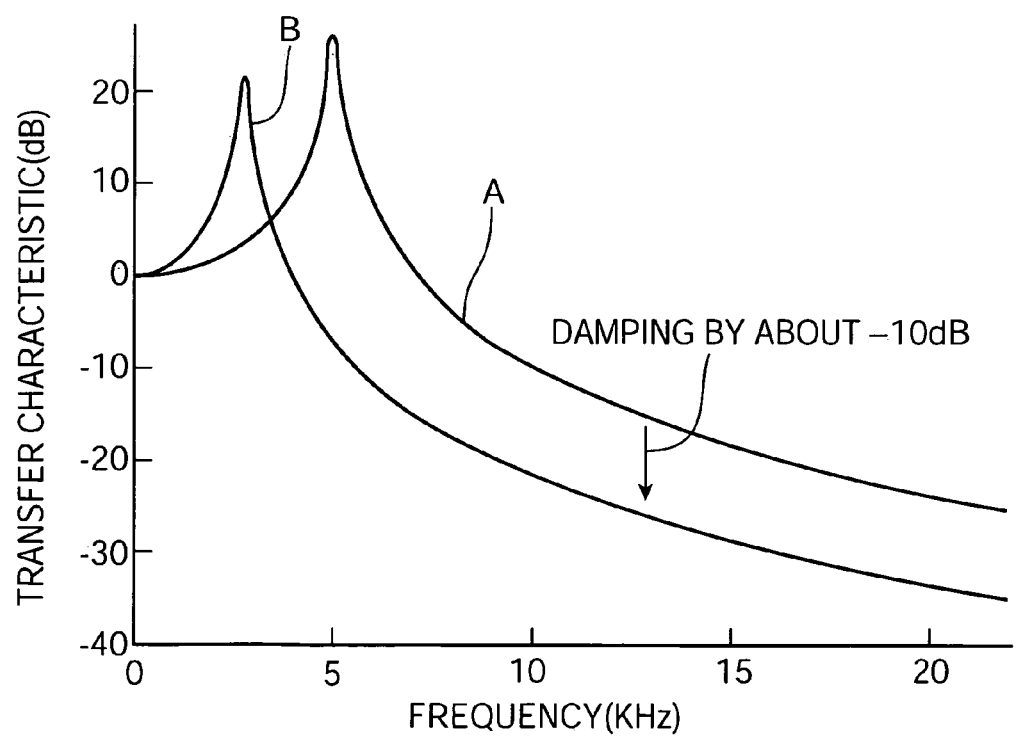
FIG. 5 is a characteristic diagram illustrating how a vibration applied from the exterior to the angular velocity sensor shown in FIG. 1 is attenuated.

Now, let it be assumed that the tuning fork unit 21, the base block 30, and the cover 34 are supported by the conventional linear shape terminals. Then, as shown by a frequency transmission characteristic A in FIG. 5, the natural frequency f in a state in which the tuning fork unit 21, the base block 30, and the cover 34 are united to each other is about 5 kHz. As is obvious from the vibration transfer characteristic A in FIG. 5, the transfer characteristic of the tuning fork unit 21 around the frequency of 13 kHz is about −15 dB.

On the other hand, the angular velocity sensor in the embodiment of the invention has a feature that the terminals 33 have the flexure portions 33b. The flexure portions 33b effectively absorb a vibration of a high frequency applied from the exterior. As a result, as is obvious from the vibration transfer characteristic B in FIG. 5, the transfer characteristic of the tuning fork unit 21 around the frequency of 13 kHz in a state in which the tuning fork unit 21, the base block 30, and the cover 34 are united to each other is about −26 dB. As compared with the use of the conventional linear shape terminals, the inventive arrangement is advantageous in obtaining the damping effect by about −10 dB in the transfer characteristic.

As mentioned above, a vibration of a high frequency applied from the exterior can be effectively absorbed and attenuated by the flexure portions 33b of the terminals 33 located in the clearance 38. In this arrangement, the circuit board 35 can be directly supported by the outer casing 39 without the need of supporting the circuit board 35 by rubber members, as required in the conventional art. This arrangement keeps the circuit board 35 from being tilted unlike the conventional art. As a result, there is no likelihood that the tuning fork unit 21 may be tilted, which is advantageous in stabilizing the output characteristic of the sensor.

Figure 6:
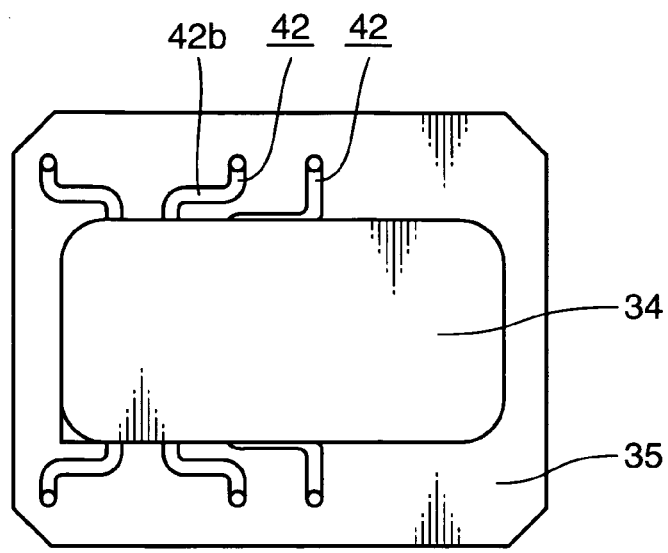
FIG. 6 is a top plan view of a modified angular velocity sensor in the invention.
Figure 7:
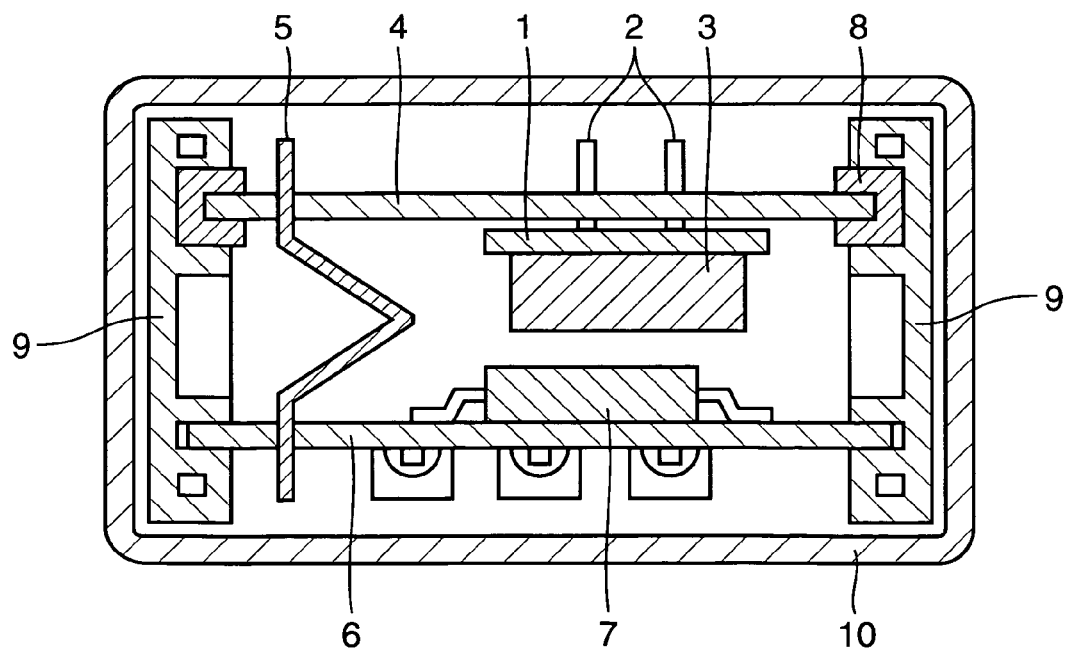
FIG. 7 is a cross-sectional side view of a conventional angular velocity sensor.

In the angular velocity sensor of the embodiment, the flexure portion 33b of the terminal 33 is formed into a thin plate. Alternatively, as shown in FIG. 6, it is possible to form a cylindrical flexure portion 42b corresponding to the flexure portion 33b by bending a terminal 42 of a cylindrical shape. The altered arrangement is also advantageous in obtaining an effect substantially equivalent to the arrangement in the embodiment.

The inventive angular velocity sensor is advantageous in providing an angular velocity sensor having a stabilized output characteristic, and is useful as an angular velocity sensor for use in posture control of a movable object such as an aircraft and an automotive vehicle, a navigation system or the like.

As mentioned above, the inventive angular velocity sensor for detecting an angular velocity of an object comprises: a tuning fork unit; a base block provided with a terminal for outputting an output signal from the tuning fork unit to the exterior; a cover for housing the tuning fork unit in a space defined by combination with the base block; a circuit board for fixing the terminal on the base block, the circuit board being provided with a processing circuit for processing the output signal from the tuning fork unit; and a casing for housing the base block, the cover, and the circuit board therein. The terminal on the base block is fixed to the circuit board, with a clearance being defined by the base block and the circuit board, and the terminal on the base block in the clearance has a flexure portion.

In the above arrangement, the terminal on the base block is fixed to the circuit board, with the clearance being defined by the base block and the circuit board, and the terminal on the base block in the clearance has the flexure portion. A vibration of a high frequency applied from the exterior can be absorbed by the flexure portion. In this arrangement, the circuit board can be directly supported by the casing, unlike a conventional arrangement in which a circuit board is supported by rubber members. This arrangement enables stabilization of an output characteristic of the angular velocity sensor without likelihood that the tuning fork unit may be tilted by tilting of the circuit board, as seen in the conventional arrangement.

Preferably, the flexure portion may be made of a thin plate having a small thickness in a direction intersecting with a vibrating surface of the tuning fork unit. In this arrangement, since the flexure portion of the terminal is made of the thin plate having the small thickness in the direction intersecting with a vibrating surface of the tuning fork unit, the flexure portion can absorb and attenuate a vibration from the exterior.

Preferably, the flexure portion may be made of a thin plate produced by plastically deforming a cylindrical lead wire. In this arrangement, since the flexure portion of the terminal is formed into the thin plate, and the soldered portion of the terminal attached to the circuit board has a cylindrical shape, the terminal capable of being fixed to the circuit board with a sufficient soldering strength can be easily fabricated.

Preferably, each of both ends of the terminal may have a cylindrical shape in cross section, and the flexure portion may have a rectangular shape in cross section. In this arrangement, a soldering strength between the terminal and the circuit board can be secured. Also, the flexure portion can absorb and attenuate a vibration from the exterior.

Preferably, the terminal may be formed by bending a cylindrical terminal. This arrangement simplifies the process for fabricating the terminal, which contributes to the production cost reduction of the sensor.

Preferably, the terminal may include a plurality of terminals, and each of the terminals may have the flexure portion. In this arrangement, since all the terminals have the flexure portions, a vibration from the exterior can be efficiently absorbed and attenuated by the flexure portions.

Preferably, an interval between the adjacent terminals among the plurality of terminals on the side of the circuit board may be wider than an interval therebetween on the side of the base block. In this arrangement, the tuning fork unit, the base block, and the cover can be stably supported by the terminals.

Preferably, the plurality of terminals may extend radially from the base block. In this arrangement, the tuning fork unit, the base block, and the cover can be further stably supported by the terminals.

Preferably, the plurality of terminals may be arranged mirror symmetrically with respect to a longitudinal central axis of the tuning fork unit. In this arrangement, the tuning fork unit, the base block, and the cover can be further stably supported by the terminals.

Preferably, the length of the flexure portion may be longer than the length of an end portion of the terminal which extends from the flexure portion toward the base block and which is not fixed to the base block, and the length of an end portion of the terminal which extends from the flexure portion toward the circuit board and which is not fixed to the circuit board. In this arrangement, since the natural frequency in a state in which the tuning fork unit, the base block, and the cover are united to each other can be further reduced, a vibration of a high frequency can be sufficiently absorbed and attenuated by the flexure portion.

Preferably, a natural frequency in a state in which the tuning fork unit, the base block, and the cover are united to each other may be 4 kHz or less, and more preferably, 3 kHz or less. In this arrangement, the natural frequency in a state in which the tuning fork unit, the base block, and the cover are united to each other can be reduced, and a vibration of a high frequency from the exterior can be sufficiently absorbed and attenuated by the flexure portion.

Preferably, the circuit board may be directly supported by the casing. In this arrangement, since the tilt of the circuit board can be lessened, and accordingly, the tilt of the tuning fork unit can be lessened, the output characteristic of the sensor can be further stabilized.

Preferably, the angular velocity sensor may further comprise a lid member for closing an opening of the casing, and the circuit board may be directly supported by the casing and the lid member. In this arrangement, since there is no likelihood that the tuning fork unit may be tilted by tiling of the circuit board, the output characteristic of the sensor can be further stabilized.

Preferably, the processing circuit may be provided on a surface of the circuit board opposite to the clearance defined by the base block and the circuit board. In this arrangement, the clearance between the base block and the circuit board can be sufficiently secured, and the natural frequency in a state in which the tuning fork unit, the base block, and the cover are united to each other can be further reduced.

This application is based on Japanese Patent Application No. 2004-294779 filed on Oct. 7, 2004, the contents of which are hereby incorporated by reference.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. An angular velocity sensor for detecting an angular velocity of an object, the angular velocity sensor comprising:
   a tuning fork unit;
   a base block provided with a terminal for outputting an output signal from the tuning fork unit to the exterior of the tuning fork unit;
   a cover for housing the tuning fork unit in a space defined by the cover and the base block;
   a circuit board for fixing the terminal on the base block, the circuit board being provided with a processing circuit for processing the output signal from the tuning fork unit; and
   a casing for housing the base block, the cover, and the circuit board therein;
   wherein the terminal on the base block is fixed to the circuit board, a clearance is defined between the base block and the circuit board, and the terminal on the base block is in the clearance and has a flexure portion;
   wherein the flexure portion is made of a thin plate having a smaller thickness in a direction intersecting with a vibrating surface of the tuning fork unit than a thickness in a direction parallel to the vibrating surface; and
   wherein the thin plate is produced by plastically deforming a cylindrical lead wire.

2. The angular velocity sensor according to claim 1, further comprising a plurality of terminals including the terminal, and comprising a plurality of flexure portions including the flexure portion, and each one of the terminals has a respective one of the flexure portions.

3. The angular velocity sensor according to claim 2, wherein an interval between adjacent terminals among the plurality of terminals on a side of the circuit board is wider than an interval between adjacent terminals on a side of the base block.

4. The angular velocity sensor according to claim 2, wherein the plurality of terminals extend radially from the base block.

5. The angular velocity sensor according to claim 2, wherein the plurality of terminals are arranged mirror symmetrically with respect to a longitudinal central axis of the tuning fork unit.

6. The angular velocity sensor according to claim 1, wherein a length of the flexure portion is longer than a length of an end portion of the terminal which extends from the flexure portion toward the base block and which is not fixed to the base block, and the length of the flexure portion is longer than a length of an end portion of the terminal which extends from the flexure portion toward the circuit board and which is not fixed to the circuit board.

7. The angular velocity sensor according to claim 1, wherein a natural frequency of a unit in which the tuning fork unit, the base block, and the cover are united to each other is 4 kHz or less.

8. The angular velocity sensor according to claim 1, wherein the circuit board is directly supported by the casing.

9. The angular velocity sensor according to claim 8, further comprising a lid member for closing an opening of the casing, wherein the circuit board is directly supported by the casing and the lid member.

10. The angular velocity sensor according to claim 1, wherein the processing circuit is provided on a surface of the circuit board opposite to the clearance defined between the base block and the circuit board.

11. An angular velocity sensor for detecting an angular velocity of an object, the angular velocity sensor comprising:
   a tuning fork unit;
   a base block provided with a terminal for outputting an output signal from the tuning fork unit to the exterior of the tuning fork unit;
   a cover for housing the tuning fork unit in a space defined by the cover and the base block;
   a circuit board for fixing the terminal on the base block, the circuit board being provided with a processing circuit for processing the output signal from the tuning fork unit; and
   a casing for housing the base block, the cover, and the circuit board therein;
   wherein the terminal on the base block is fixed to the circuit board, a clearance is defined between the base block and the circuit board, and the terminal on the base block is in the clearance and has a flexure portion; and
   wherein each one of both ends of the terminal has a cylindrical shape in cross section, and the flexure portion has a rectangular shape in cross section.

12. The angular velocity sensor according to claim 11, wherein a length of the flexure portion is longer than a length of an end portion of the terminal which extends from the flexure portion toward the base block and which is not fixed to the base block, and the length of the flexure portion is longer than a length of an end portion of the terminal which extends from the flexure portion toward the circuit board and which is not fixed to the circuit board.

13. The angular velocity sensor according to claim 11, wherein a natural frequency of a unit in which the tuning fork unit, the base block, and the cover are united to each other is 4 kHz or less.

14. The angular velocity sensor according to claim 11, wherein the circuit board is directly supported by the casing.

15. The angular velocity sensor according to claim 11, wherein the processing circuit is provided on a surface of the circuit board opposite to the clearance defined between the base block and the circuit board.

16. An angular velocity sensor for detecting an angular velocity of an object, the angular velocity sensor comprising:
   a tuning fork unit;
   a base block provided with a terminal for outputting an output signal from the tuning fork unit to the exterior of the tuning fork unit;
   a cover for housing the tuning fork unit in a space defined by the cover and the base block;
   a circuit board for fixing the terminal on the base block, the circuit board being provided with a processing circuit for processing the output signal from the tuning fork unit; and
   a casing for housing the base block, the cover, and the circuit board therein;
   wherein the terminal on the base block is fixed to the circuit board, a clearance is defined between the base block and the circuit board, and the terminal on the base block is in the clearance and has a flexure portion; and
   wherein the terminal is formed by bending a cylindrical terminal.

17. The angular velocity sensor according to claim 16, wherein a length of the flexure portion is longer than a length of an end portion of the terminal which extends from the flexure portion toward the base block and which is not fixed to the base block, and the length of the flexure portion is longer than a length of an end portion of the terminal which extends from the flexure portion toward the circuit board and which is not fixed to the circuit board.

18. The angular velocity sensor according to claim 16, wherein a natural frequency of a unit in which the tuning fork unit, the base block, and the cover are united to each other is 4 kHz or less.

19. The angular velocity sensor according to claim 16, wherein the circuit board is directly supported by the casing.

20. The angular velocity sensor according to claim 16, wherein the processing circuit is provided on a surface of the circuit board opposite to the clearance defined between the base block and the circuit board.

* * * * *